United States Patent [19]

Tamaki et al.

[11] Patent Number: 5,546,890

[45] Date of Patent: Aug. 20, 1996

[54] REMOVING INTERHALOGEN COMPOUNDS FROM SEMICONDUCTOR MANUFACTURING EQUIPMENT

[75] Inventors: Tokuhiko Tamaki; Shinichi Imai, both of Osaka, Japan

[73] Assignee: Matsushita Electric Industrial Co., Ltd., Osaka, Japan

[21] Appl. No.: 391,666

[22] Filed: Feb. 21, 1995

[30] Foreign Application Priority Data

Feb. 21, 1994 [JP] Japan .................................. 6-022272

[51] Int. Cl.$^6$ ............................. C30B 25/00; B08B 9/03; H01L 21/00
[52] U.S. Cl. .................... 117/102; 134/22.11; 134/22.12; 437/250
[58] Field of Search ........................ 423/481; 134/22.11, 134/22.14; 117/102; 437/250

[56] References Cited

U.S. PATENT DOCUMENTS

| | | | |
|---|---|---|---|
| 4,369,031 | 1/1983 | Goldman et al. | 432/198 |
| 4,464,222 | 8/1984 | Gutsche | 156/613 |
| 5,089,441 | 2/1992 | Moslehi | 437/225 |
| 5,212,118 | 5/1993 | Saxena | 437/235 |
| 5,348,587 | 9/1994 | Eichman et al. | 118/723 |

FOREIGN PATENT DOCUMENTS

| | | |
|---|---|---|
| 1-152274 | 6/1989 | Japan . |
| 4-323389 | 11/1992 | Japan . |
| 5-243163 | 9/1993 | Japan . |

*Primary Examiner*—Gary P. Straub
*Attorney, Agent, or Firm*—McDermott, Will & Emery

[57] ABSTRACT

Inert gas is introduced in and then discharged from the inside of a pneumatic device such as a chamber, a pipe or the like which is used for producing semiconductor devices and through which interhalogen compound gas passes. Then, gas having humidity exceeding 1% is introduced into the chamber or the like. Before the gas having humidity exceeding 1% is introduced into the chamber or the like, the interhalogen compound gas in the chamber or the like is lowered in concentration to such an extent that the inner wall of the chamber or the like is not corroded. Thereafter, when the gas having humidity exceeding 1% is introduced, the interhalogen compound (for example, $ClF_3$ gas) is decomposed into a substance such as HF or the like of which toxicity is low and of which adsorptivity to the inner wall of the chamber or the like is also low. Thereafter, the inside of the chamber or the like is opened to atmosphere. Thus, when the method above-mentioned is used for opening, to atmosphere, the inside of a pneumatic device which is used for producing semiconductor devices and in which etching, CVD, cleaning or the like is executed using interhalogen compound gas, this prevents not only the inner wall of the pneumatic device from being corroded, but also the human body from being adversely affected.

7 Claims, 9 Drawing Sheets

REMOVING INTERHALOGEN COMPOUNDS FROM SEMICONDUCTOR MANUFACTURING EQUIPMENT

BACKGROUND OF THE INVENTION

The present invention relates to a method by which, when producing semiconductor devices, the inside of a pneumatic device through which interhalogen compound gas such as $ClF_3$ or the like passes, is opened to atmosphere while assuring the safety, and also relates to a variety of devices to which such a method can be applied.

In the field of producing semiconductor devices, attention is recently given to interhalogen compound gas such as $ClF_3$ gas or the like serving as gas with which semiconductor wafers are etched, CVD is conducted or the inside of a chamber or the like is cleaned. However, the interhalogen compound gas has the following nature to which care must be used in handling the same.

For example, a $ClF_3$ molecule which is an interhalogen compound, has a Cl—F binding energy as small as 258.6 KJ/mol and has the nature that Cl is separated from F to fluorinate other substance. With the use of such nature, $ClF_3$ gas is proposed (i) as cleaning gas for regularly removing a layer such as a polysilicon layer, a silicon carbide layer or the like formed on the inner wall of a chamber or the like forming a reaction chamber in a CVD apparatus (U.S. Pat. No. 4,998,979) or (ii) as etching gas for etching a polysilicon layer, a silicon nitride layer or the like (Japanese Patent Laid-Open Publication 2- 68948). In particular, the interhalogen compound gas such as $ClF_3$ gas or the like has a strong reactivity that it reacts with silicon at room temperature even though it is not brought in a state of plasma. Accordingly, the interhalogen compound gas can fulfill excellent function in an etching process or the like. However, having such a strong reactivity means that the interhalogen compound gas is considerably toxic. For etching gas, there is determined a TLV value or gas concentration under which work for 8 hours or more is dangerous. Based on such a TLV value, there is judged the toxicity of etching gas. While the TLV value of prevailing etching gas such as chlorine, HF, HCl, HBr or the like, is 1 ppm, the TLV value of $ClF_3$ gas is 0.1 ppm, which is equivalent to toxicity of 10 times or more of chlorine gas or the like.

It is therefore required to lower residual $ClF_3$ gas in concentration to assure the safety of workers when replacing a part of a reaction chamber or a pneumatic device such as a pump or the like in which $ClF_3$ gas is used, when replacing a $ClF_3$ gas bomb or when replacing a medicine for a waste gas processing device. To lower the concentration of residual reactive gas, there has conventionally been made provision to generate plasma using safe gas such as $SF_6$ or the like or to substitute the atmosphere with inert gas such as dry nitrogen or the like. The reason of why dry nitrogen having humidity not greater than 1% has been used, is because a reaction product, hydrochloric acid, of moisture with reactive gas, in particular chlorine-type gas, readily corrodes metal.

On the other hand, the following techniques are available as a method of cleaning, flushing, purging, or removing a halogen-element-containing gas which remains in a chamber or component into which the halogen-element-containing gas has been introduced.

For example, Japanese Patent Laid-Open Publication 4-323389 discloses a method of passing, through the chamber, inert gas or air containing moisture not less than a predetermined value, such that residual halogen gas is removed.

Japanese Patent Laid-Open Publication 5-243163 discloses a method by which inert gas or air heated to not less than 50° C. is passed through a chamber into which halogen-element-containing gas has been introduced, such that residual halogen-element-containing gas is removed.

In each of the techniques in the publications above-mentioned, the residual halogen-element-containing gas is removed to prevent the chamber forming the reaction chamber from being corroded.

Out of examples of the halogen-element-containing gas, the interhalogen compound gas is very strong in reactivity. Accordingly, it is turned out that, when moisture-containing-air or moisture-containing-inert gas is introduced, according to any of the techniques of the publications above-mentioned, into the chamber in which the interhalogen compound gas remains, metal such as aluminium, SUS or the like forming the inner wall of the chamber is immediately corroded. When iron oxide or the like is produced, even in a small amount, due to the corrosion of metal, metallic ions produced as a result of decomposition of the iron oxide or the like in plasma at the time of a CVD processing or the like, mixingly enter a semiconductor material. This exerts serious adverse effect on the semiconductor device. Accordingly, each of the techniques discussed in the publications above-mentioned is effective for $SF_6$ gas, $NF_3$ gas, $CF_4$ gas in preventing the corrosion of the chamber forming the reaction chamber, but results in acceleration of corrosion with respect to interhalogen compound gas such as $ClF_3$ gas or the like.

Thus, to remove interhalogen compound gas remaining in the chamber or the like, there is only available a conventional method of utilizing the generation of $SF_6$ plasma or of substituting the atmosphere in the chamber with inert gas such as nitrogen gas or the like.

However, the interhalogen compound gas such as $ClF_3$ gas or the like has strong toxicity and high adsorptivity with respect to metal such as SUS, aluminium or the like. Accordingly, for example when it is intended to lower the concentration of interhalogen compound gas remaining in the vacuum system or the pump unit by utilizing the generation of $SF_6$ plasma or by substituting the atmosphere with nitrogen gas, it takes much time to lower the concentration of $ClF_3$ gas adsorbed to the inner wall of the chamber, to not greater than the TLV value. For example, as to substitution with nitrogen gas, even though the atmosphere was substituted with dry nitrogen for 24 hours, the concentration of the $ClF_3$ gas in the pipes could not be lowered to not greater than 0.1 ppm.

SUMMARY OF THE INVENTION

In view of the foregoing, the present invention is proposed with the following objects.

It is a first object of the present invention to provide a method of opening, to atmosphere, the inside of a pneumatic device or component used for production of semiconductor devices, which method is capable of lowering, in a short period of time, the concentration of residual interhalogen compound gas to not greater than the TLV value, enabling maintenance work to be readily carried out in a safe manner.

It is a second object of the present invention to provide an apparatus to which the atmosphere opening method above-mentioned can be applied, as a semiconductor device producing apparatus having a chamber or component in which interhalogen compound gas is used.

It is a third object of the present invention to provide an apparatus to which the atmosphere opening method above-mentioned can be applied, as an apparatus for supplying interhalogen compound gas into a chamber or the like.

It is a fourth object of the present invention to provide an apparatus to which the atmosphere opening method above-mentioned can be applied, as an apparatus for decomposing gas discharged from a chamber or the like.

To achieve the first object, the present invention provides a method of opening, to atmosphere, the inside of a pneumatic device such as a chamber, a pipe, a valve, a pump or the like which is used for producing semiconductor devices and through which interhalogen compound gas passes in a hermetically sealed manner, the method comprising:

the step of introducing inert gas into the pneumatic device;

the step of discharging the inert gas from the pneumatic device;

the step of introducing gas having humidity exceeding 1%, into the pneumatic device from which the inert gas has been discharged, thereby to decompose the interhalogen compound gas;

the step of discharging a substance produced as a result of decomposition of the interhalogen compound; and the step of opening, to atmosphere the pneumatic device from which the substance has been discharged.

According to the method above-mentioned, when the inert gas is introduced in and then discharged from the pneumatic device, the interhalogen compound gas molecules adsorbed to the inner wall of the pneumatic device are substituted with the inert gas molecules, thereby to lower the concentration of the interhalogen compound gas in the pneumatic device to such an extent that the pneumatic device is not corroded. When the gas having humidity exceeding 1% is then introduced, the inter-halogen compound molecules having a relatively small binding energy, are decomposed by the reaction thereof with water such that the interhalogen compound molecules are lowered in adsorptivity to the inner wall of the pneumatic device. Accordingly, a substance produced as a result of the decomposition of the interhalogen compound molecules is readily discharged. Thus, when the inside of the pneumatic device is opened to atmosphere, the concentration of the interhalogen compound gas has already been lowered to such an extent that it exerts no adverse effect on the human body. This assures the working safety.

The interhalogen compound gas may be at least one selected from the group consisting of $ClF_3$ gas, $BrF_3$ gas, $BrF_3$ gas, $BrCl$ gas and $IF_3$ gas.

Out of examples of the interhalogen compound, $ClF_3$ gas, $BrF_3$ gas, $BrF_5$ gas. $BrCl$ gas and $IF_3$ gas fulfil excellent function as cleaning gas, CVD gas and etching gas, but are high in toxicity and corrosiveness. In the $ClF_3$ molecules for example, the Cl-F binding energy is as very small as 254 KJ/mol, but the H-F binding energy is as high as 566 KJ/mol. As shown in the following chemical formula 1, the $ClF_3$ molecules are readily decomposed into HF or the like due to the presence of moisture.

$$ClF_3 + 2H_2O \rightarrow 3HF + HCl + O_2 \qquad (1)$$

The adsorptivity of the $ClF_3$ and HF molecules with respect to metal such as aluminium or the like is not quantified. However, it is known by experience that the HF molecules are considerably weak in adsorptivity with respect to metal such as aluminium, SUS or the like as compared with the $ClF_3$ molecules. It is also known by experience that the substitution with inert gas causes $ClF_3$ gas or the like to be lowered in concentration to such an extent that metal such as aluminium, SUS or the like is not corroded. Accordingly, the effect of the invention according to claim 1 can securely be produced on a pneumatic device using $ClF_3$ gas or the like.

According to the present invention, the step of introducing inert gas and the step of discharging inert gas may alternately be repeated at a plurality of times. Further, the step of introducing inert gas and the step of discharging inert gas may simultaneously be carried out. Before the gas having humidity exceeding 1% is introduced into a pneumatic device the concentration of the interhalogen compound gas in the pneumatic device is considerably lowered. This further securely prevents the inner wall of the pneumatic device from being corroded.

Likewise, the step of introducing gas having humidity exceeding 1% and the step of discharging the gas may alternately be repeated at a plurality of times.

At the step of introducing inert gas, the inert gas in the pneumatic device may be pushed out with the pressure of the inert gas increased, such that the inert gas discharging step is carried out simultaneously with the inert gas introducing step, and at the step of introducing gas having humidity exceeding 1%, the gas in the pneumatic device may be pushed out with the pressure of the gas increased, such that the step of discharging gas having humidity exceeding 1% is carried out simultaneously with the step of introducing such gas. The step of simultaneously introducing and discharging inert gas and the step of simultaneously introducing and discharging gas having humidity exceeding 1%, may alternately be repeated at a plurality of times. According to any of the methods above-mentioned, the concentration of the interhalogen compound gas can effectively be lowered even though the pneumatic device cannot be exhausted by a vacuum pump or the like.

According to the present invention, there may further be provided the step of sucking the pneumatic device to depressurize the same, thereby to discharge the interhalogen compound gas from the pneumatic device, this sucking step being carried out before the inert gas introducing step. According to such an arrangement, there may be shortened the time required for substituting the atmosphere of the pneumatic device with inert gas.

Preferably, the step of introducing gas having humidity exceeding 1% is started when the concentration of the interhalogen compound gas in the pneumatic device is not greater than 100 ppm. According to such an arrangement, when the gas having humidity exceeding 1% is introduced into the pneumatic device, the corrosion of the inner wall of the pneumatic device can securely be prevented.

Air may be used as the gas having humidity exceeding 1%.

To achieve the second object, the present invention provides a semiconductor device producing apparatus arranged such that interhalogen compound gas is introduced from an interhalogen compound supply source into a wafer processing chamber and that there is executed a processing such as etching, CVD or the like of semiconductor wafers or a processing such as cleaning of the wafer processing chamber, the apparatus comprising:

a chamber forming the wafer processing chamber;

means for introducing the interhalogen compound gas into the chamber;

means for introducing gas having humidity exceeding 1%, into the chamber;

means for introducing inert gas into the chamber; and means for discharging the gases in the chamber to the outside thereof.

According to the present invention, the means for introducing interhalogen compound gas into the chamber may be so arranged as to introduce at least one selected from the group consisting of $ClF_3$ gas, $BrF_3$ gas, $BrF_5$ gas, $BrCl$ gas and $IF_3$ gas.

The means for introducing gas having humidity exceeding 1% may be so arranged as to introduce air.

In each of these semiconductor device producing apparatus, the method of opening the pneumatic device to atmosphere above-mentioned can be embodied. Thus, when the chamber is opened to atmosphere for maintenance, both the corrosion of the chamber inner wall and the adverse effect on the human body can effectively be prevented.

According to the present invention, the semiconductor device producing apparatus may further comprise means for controlling the inert gas introducing means and the means for introducing gas having humidity exceeding 1%, such that the inert gas and the gas having humidity exceeding 1% are automatically introduced and discharged. Such an arrangement automatically lowers the concentration of the interhalogen compound gas in the chamber, enabling the desired maintenance to be carried out.

To achieve the third object, the present invention provides a gas supply device for supplying interhalogen compound gas from an interhalogen compound gas supply source to a pneumatic device, the gas supply device comprising:

a gas supply pipe for connecting the interhalogen compound gas supply source to the pneumatic device;

means for introducing gas having humidity exceeding 1%, into the gas supply pipe; and means for introducing inert gas into the gas supply pipe.

According to the present invention, the means for introducing gas having humidity exceeding 1%, may be so arranged as to introduce air.

In each of the gas supply devices above-mentioned, the method of opening a pneumatic device to atmosphere above-mentioned can be embodied. Thus, when the chamber is opened to atmosphere for maintenance, the corrosion of the chamber inner wall and the adverse effect on the human body can effectively be prevented.

To achieve the fourth object, the present invention provides a waste gas processing device for processing interhalogen compound gas introduced in and then discharged from a pneumatic device, the waste gas processing device comprising:

a gas discharge pipe connected to the pneumatic device;

means for introducing inert gas into the gas discharge pipe; and means for introducing gas having humidity exceeding 1%, into the gas discharge pipe.

The means for introducing gas having humidity exceeding 1%, may be so arranged as to introduce air.

In each of the waste gas processing devices above-mentioned, the method of opening a pneumatic device to atmosphere above-mentioned can be embodied. Thus, when the chamber is opened to atmosphere for maintenance, the corrosion of the chamber inner wall and the adverse effect on the human body can effectively be prevented.

DETAILED DESCRIPTION OF PREFERRED EMBODIMENTS

First Embodiment

Figure 1:
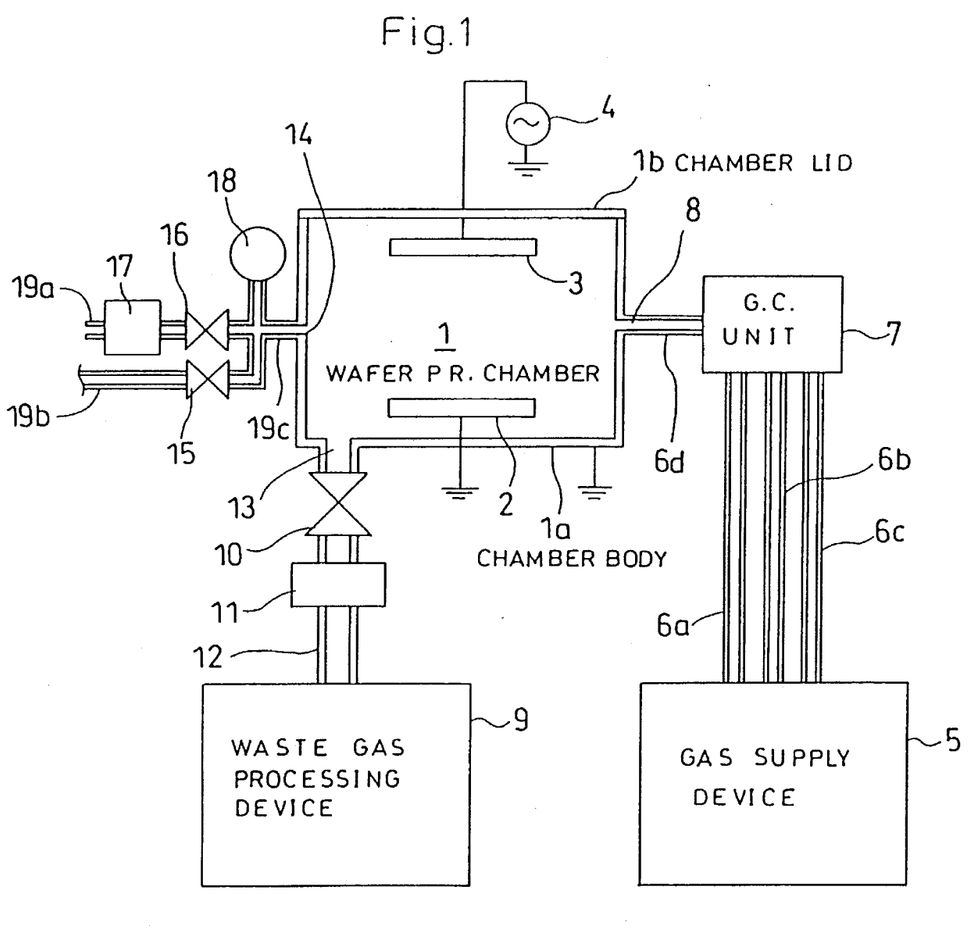
FIG. 1 is a block diagram schematically illustrating the arrangement of a CVD apparatus as a semiconductor device producing apparatus according to the present invention.

FIG. 1 is a pipe system diagram illustrating the arrangement of a CVD apparatus and its peripheral devices according to each of first to third embodiments of the present invention. In FIG. 1, a wafer processing chamber 1 is formed by a chamber body 1a and a chamber lid 1b which covers the top of the chamber body 1a. The chamber body 1a and chamber lid 1b are installed and grounded in a clean room (not shown) of which humidity is maintained at 60%. At the lower portion of the wafer processing chamber 1, there is horizontally disposed a plate-like sample stand 2 serving as an earth electrode. At the upper portion of the wafer processing chamber 1, there is disposed an opposite electrode 3 which faces the sample stand 2. An RF power source 4 supplies an electric power of high frequency of 13.58 MHz to the opposite electrode 3. The chamber body 1a of the wafer processing chamber 1 has a process gas inlet port 8, a processing chamber exhaust port 13 and an air inlet port 14. The first embodiment is characterized in that the chamber body 1a of the wafer processing chamber 1 has, in addition to the process gas inlet port 8, the air inlet port 14 also serving as a nitrogen gas inlet port, as will be discussed later. More specifically, when process gas and air are introduced into the chamber through a common inlet port as done in a conventional CVD apparatus, the pipes, the valves and the like are corroded. On the other hand, the first embodiment has the process gas inlet port 8 and the air inlet port 14 which are independent from each other, such that interhalogen compound gas such as $ClF_3$ gas or the like will come in contact with air only in the chamber. In the first embodiment, the air inlet port 14 also serves as a nitrogen gas inlet port, but the air inlet port and the nitrogen gas inlet port may individually be disposed.

There are also disposed (i) a gas supply device 5 for supplying, to the wafer processing chamber 1, reaction gases including $SiF_4$ gas and $O_2$ gas as process gases for forming a silicon oxide layer and $ClF_3$ gas or the like as cleaning gas, and (ii) a gas control unit 7 including a mass flow controller (not shown) or the like. The gas supply device 5 and the gas control unit 7 are connected to each other by first to third process gas pipes 6a to 6c. The gas control unit 7 and the process gas inlet port 8 of the wafer processing chamber 1 are connected to each other by a fourth process gas pipe 6d. More specifically, the gas control unit 7 is arranged to select either one of three types of gases supplied from the gas supply device 5 through the first to third process gas pipes 6a to 6c. While the flow amount is being adjusted, the desired process gas is introduced into the wafer processing chamber 1 through the fourth process gas common pipe 6d.

There is disposed a waste gas processing device 9 for processing a variety of gases discharged from the wafer processing chamber 1 such that the gases become nonpoisonous. The waste gas processing device 9 and the processing chamber exhaust port 13 at the chamber body 1a of the wafer processing chamber 1 are connected to each other by a processing chamber exhaust pipe 12. Disposed at the processing chamber exhaust pipe 12 are an exhaust valve 10 for opening/closing the passage, and a rotary pump 11 for adjusting the pressure in the wafer processing chamber 1. The process gas which has not been consumed in the wafer processing chamber 1, is discharged and sent, through the processing chamber exhaust pipe 12, to the waste gas processing device 9 which is a peripheral device. Thus, only safe gas is discharged outside from the waste gas processing device 9.

There are shown a pipe 19a for supplying air into the wafer processing chamber 1, a pipe 19b for supplying, to the wafer processing chamber 1, nitrogen gas which is inert gas. The air supply pipe 19a and the nitrogen gas supply pipe 19b are branched from a common pipe 19c directly connected to the air inlet port 14, and respectively extend to a position which is in an atmospheric state outside of the wafer processing chamber 1 in the clean room, and to a nitrogen gas bomb (not shown). A nitrogen leak valve 15 is disposed at the nitrogen gas supply pipe 19b. An air leak valve 16 and a filter 17 for collecting particles from the air, are disposed at the air supply pipe 19a. A pressure sensor 18 is attached to the common pipe 19c.

In the CVD apparatus having the arrangement abovementioned, a variety of maintenance works are generally required for the inside of the chamber forming the wafer processing chamber 1. When actually required, maintenance is conducted with the chamber lid 1b opened. In the peripheral devices such as the gas supply device 5 and the waste gas processing device 9, too, there is required maintenance such as replacement of the bomb, the medicine or the like.

Figure 2:
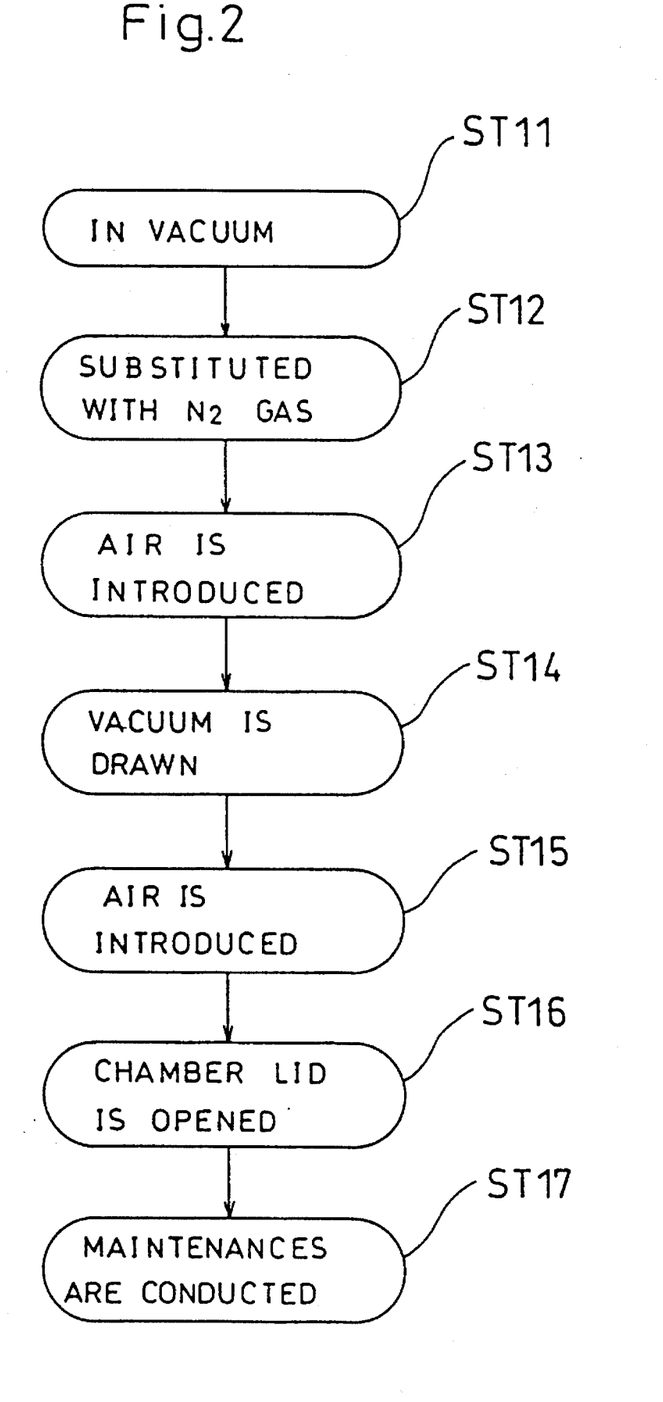
FIG. 2 is a flow chart illustrating a method according to a first embodiment of the present invention, the method being arranged to open, to atmosphere, a wafer processing chamber when the wafer processing chamber is subjected to maintenance work.

Based on the flow chart in FIG. 2, the following will discuss, with reference to FIG. 1, the procedure of opening the wafer processing chamber 1 to atmosphere at the time of maintenance.

At the initial step ST11, a vacuum is drawn in the wafer processing chamber 1 by the rotary pump 11 such that the wafer processing chamber 1 is maintained substantially in a vacuum. However, a small amount (not greater than 100 ppm) of $ClF_3$ gas is adsorbed in the inner wall of the chamber body 1a and the chamber lid 1b of the wafer processing chamber 1.

At the step ST12, the exhaust valve 10 is closed and the nitrogen leak valve 15 is opened to introduce nitrogen gas into the wafer processing chamber 1. When the pressure sensor 18 detects that the pressure in the wafer processing chamber 1 becomes one atmospheric pressure or more, the exhaust valve 10 is opened. While the introduction of the nitrogen gas is continued, nitrogen gas in the wafer processing chamber 1 is discharged by the rotary pump 11. More specifically, the introduction of nitrogen gas into the wafer processing chamber 1 and the discharge thereof from the wafer processing chamber 1 are simultaneously conducted for a predetermined period of time (about 30 minutes in the first embodiment) such that the atmosphere is substituted with nitrogen gas. There may be repeated, a plurality of times (for example, three times), both the step of introducing nitrogen gas until the pressure in the wafer processing chamber 1 becomes nearly one atmospheric pressure, and the step of evacuating the wafer processing chamber 1 filled with nitrogen gas by the rotary pump 11.

At a step ST13, the exhaust valve 10 is closed and the air leak valve 16 is opened such that air from which particles have been removed by the filter 17, is introduced into the wafer processing chamber 1 through the air inlet port 14. When the pressure sensor 18 detects that the pressure in the wafer processing chamber 1 becomes the atmospheric pressure or more, the air leak valve 16 is closed. At this time, the reaction of the chemical formula 1 takes place. Thus, $ClF_3$ gas adsorbed in the inner wall of the chamber body 1a or the chamber lid 1b, is reacted with moisture in the air and then decomposed into HF gas or the like.

At a step ST14, the exhaust valve 10 is opened and the air in the wafer processing chamber 1 is discharged through the processing chamber exhaust port 13 by the rotary pump 11. At this point of time, the decomposition product such as HF or the like is discharged together with the air.

At a step ST15, when the pressure in the wafer processing chamber 1 is sufficiently lowered, the exhaust valve 10 is closed and the air leak valve 16 is opened likewise at the step ST13, and air from which particles have been removed from the filter 17, is then introduced through the air inlet port 14 into the wafer processing chamber 1. When it is made sure by the pressure sensor 18 that the pressure in the wafer processing chamber 1 becomes the atmospheric pressure, the air leak valve 16 is closed.

At a step ST16, the chamber lid 1b is opened. At a seep ST17, predetermined maintenance is then conducted.

When the atmosphere opening method above-mentioned is conducted, the following effect is produced. In general, the concentration of $ClF_3$ gas remaining in the wafer processing chamber 1 is high immediately after there have been used process conditions that the partial pressure of the $ClF_3$ gas is high. Accordingly, when air introduction is immediately conducted at the step ST13, the inner walls of the chamber body 1a and the chamber lid 1b forming the wafer processing chamber 1 are possibly corroded. In the first embodiment, nitrogen gas is once introduced into the wafer processing chamber 1 to substitute the $ClF_3$ gas with the nitrogen gas. This lowers the concentration of the $ClF_3$ gas in the wafer processing chamber 1 to the order of ppm. Thereafter, gas having humidity exceeding 1% (air in this embodiment) is introduced into the wafer processing chamber 1. This not only prevents the inner walls of the chamber body 1a and the chamber lid 1b from being corroded, but also lowers the concentration of detrimental $ClF_3$ gas to such an extent which exerts no adverse effect on the human body.

Figure 9:
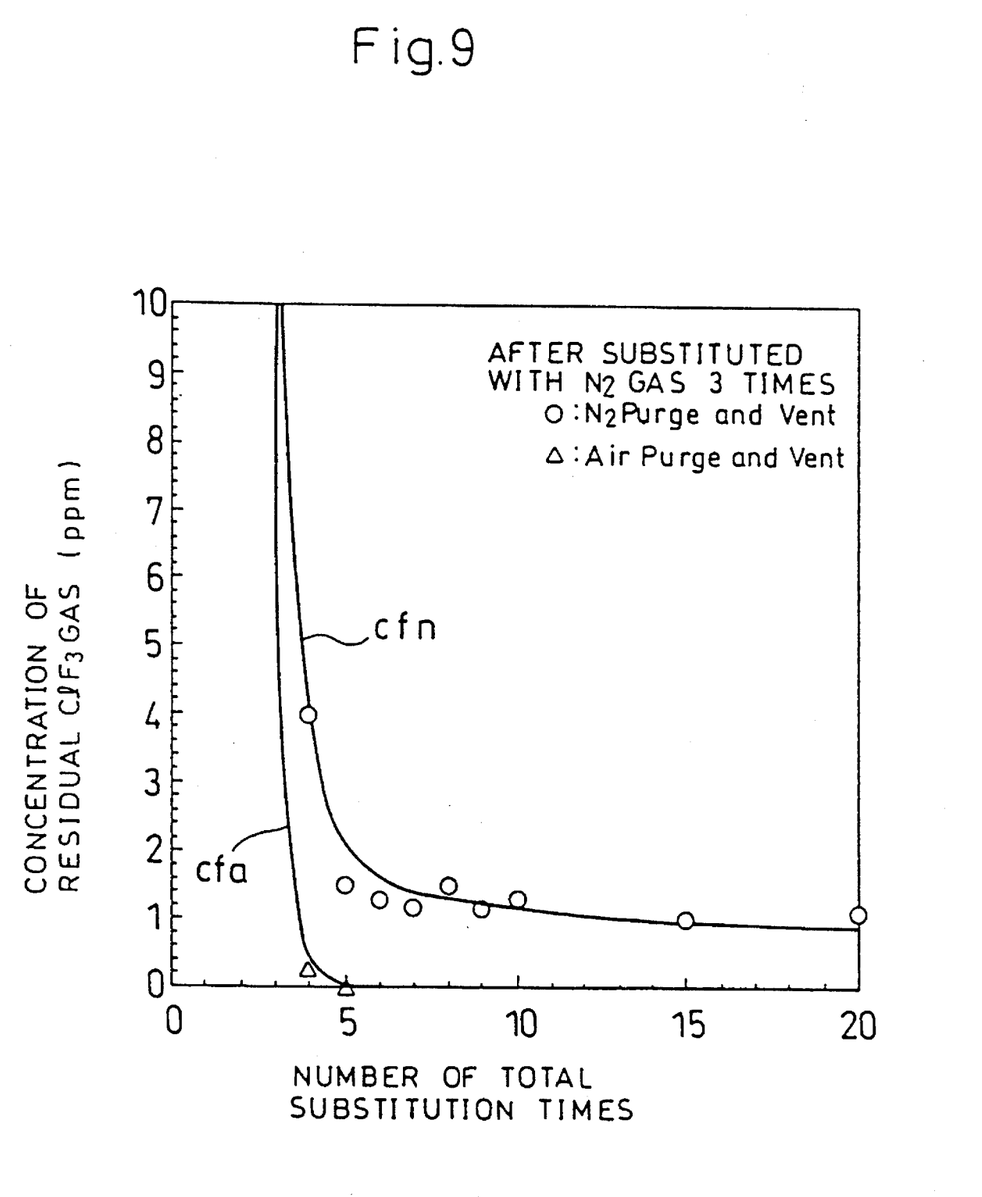
FIG. 9 is a view of the relationship between the concentration of residual $ClF_3$ gas and the number of atmosphere substitution times, as obtained from the tests.

FIG. 9 shows data of the effect that the concentration of the residual $ClF_3$ gas is lowered at each of the steps ST12 and the steps ST13 to 15 in FIG. 2. A curve Cfn shows the characteristics of reduction in the concentration of $ClF_3$ gas with respect to the number of times at which the introduction and discharge of nitrogen gas are repeated (substitution of the atmosphere in the wafer processing chamber 1 with nitrogen gas). A curve Cfa shows the characteristics of reduction in the concentration of $ClF_3$ gas with respect to the number of times at which the introduction and discharge of air are repeated. It is noted that the axis of abscissa shows the total number of substitution times including (i) three times at which the atmosphere in the wafer processing chamber 1 is substituted with nitrogen gas, and (ii) the number of times at which the atmosphere in the wafer processing chamber 1 is substituted with nitrogen gas or air after the atmosphere in the wafer processing chamber 1 has been substituted with nitrogen gas three times. For example, the point of 5 times as the total number of substitution times on the curve Cfa, shows the concentration of the residual $ClF_3$ gas after the atmosphere was substituted with air two times after the atmosphere had been substituted with nitrogen gas three times. The point of 5 times as the total number of substitution times on the curve Cfn shows the concentration of the residual $ClF_3$ gas after the atmosphere was substituted with nitrogen gas five times.

As shown in FIG. 9, the concentration of $ClF_3$ gas can be lowered to about 10 ppm by substituting the atmosphere in the wafer processing chamber with nitrogen gas three times. Thus, it was made sure that, when the concentration of $ClF_3$ gas became to about 10 ppm, the inner walls of the chamber body 1a and the chamber lid 1b were hardly corroded even though gas having humidity exceeding 14 was thereafter introduced into the wafer processing chamber 1. On the other hand, if it is intended to lower the concentration of $ClF_3$ gas to 1 ppm or less only by substitution of the atmosphere in the wafer processing chamber 1 with nitrogen gas, it is required to carry out such substitution for a very long period of time. The time required for substituting the atmosphere in the wafer processing chamber 1 in this test, was about 10 minutes. It was turned out that, if the atmosphere is substituted only with nitrogen gas, the concentration of $ClF_3$ gas was saturated and could not be lowered any more even though the atmosphere was substituted with nitrogen gas for about 50 minutes (five times of substitution). For example, when substituting the atmosphere with nitrogen gas, the concentration of $ClF_3$ gas in the pipes could not be lowered to not greater than 0.1 ppm even by substituting the atmosphere with dry nitrogen for 24 hours. On the contrary, the concentration of $ClF_3$ gas can quickly be lowered to not greater than the TLV value or 0.1 ppm by substituting the atmosphere in the wafer processing chamber 1 with air after the atmosphere has been substituted with nitrogen gas three times.

Second Embodiment

Figure 3:
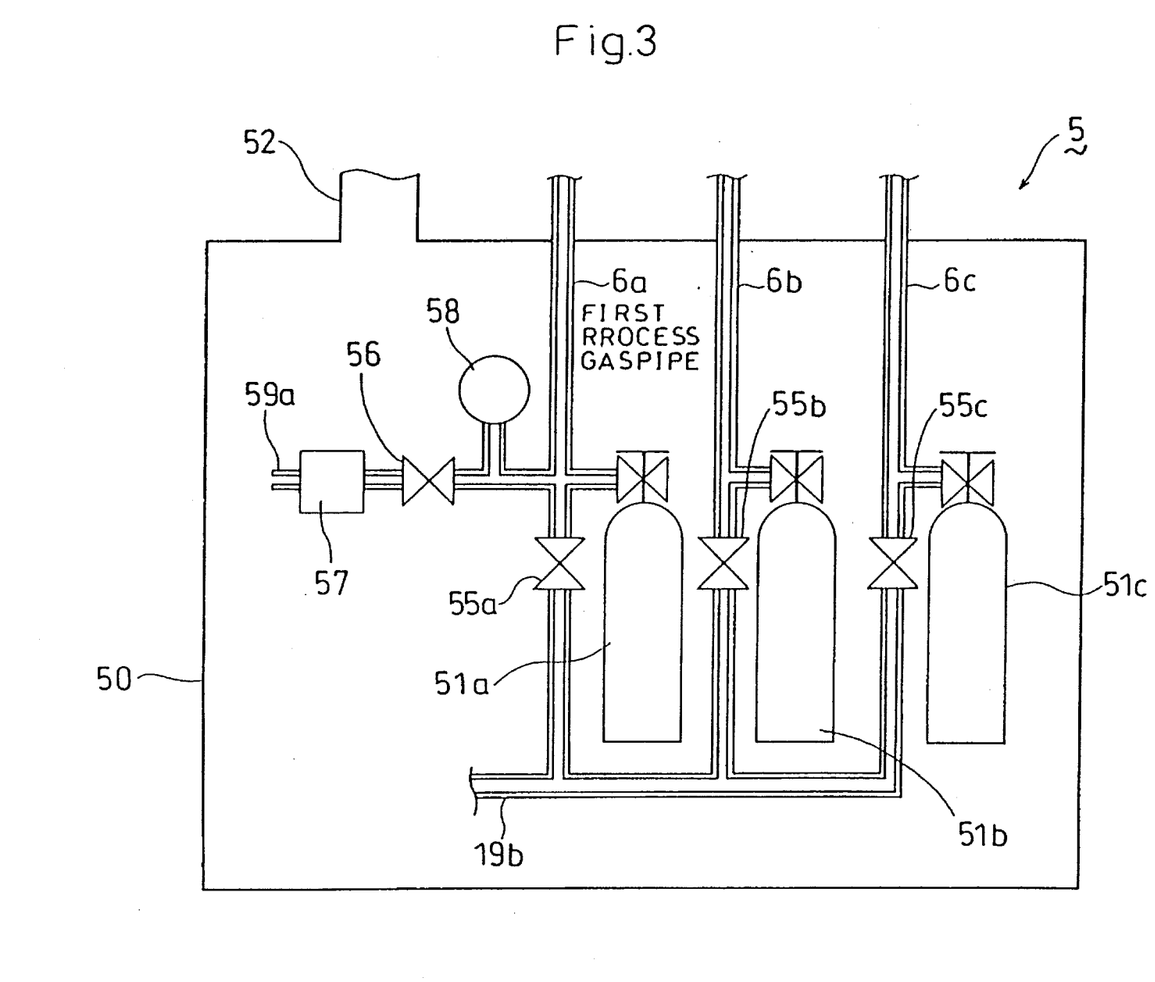
FIG. 3 is a section view schematically illustrating the arrangement of a gas supply device according to a second embodiment of the present invention.
Figure 4:
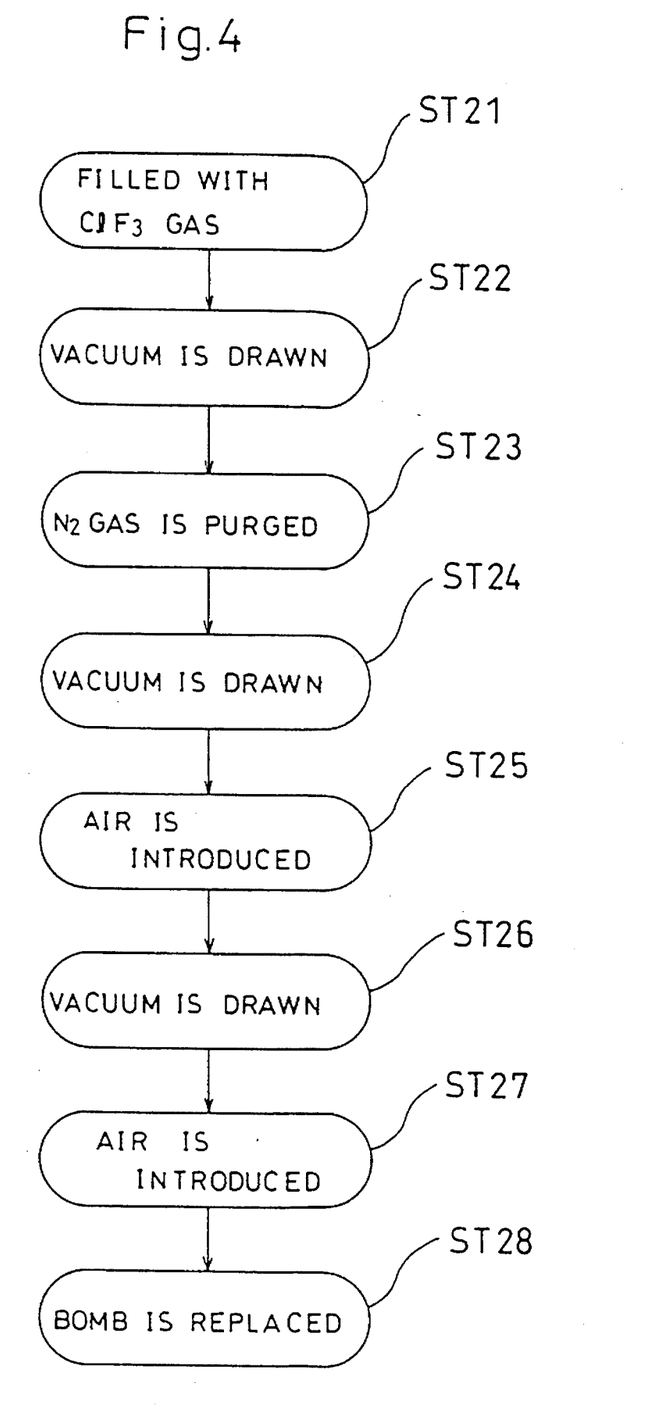
FIG. 4 is a flow chart of a method of opening, to atmosphere, a process gas pipe at the time when replacing a $ClF_3$ supply bomb in the gas supply device according to the second embodiment.
Figure 7:
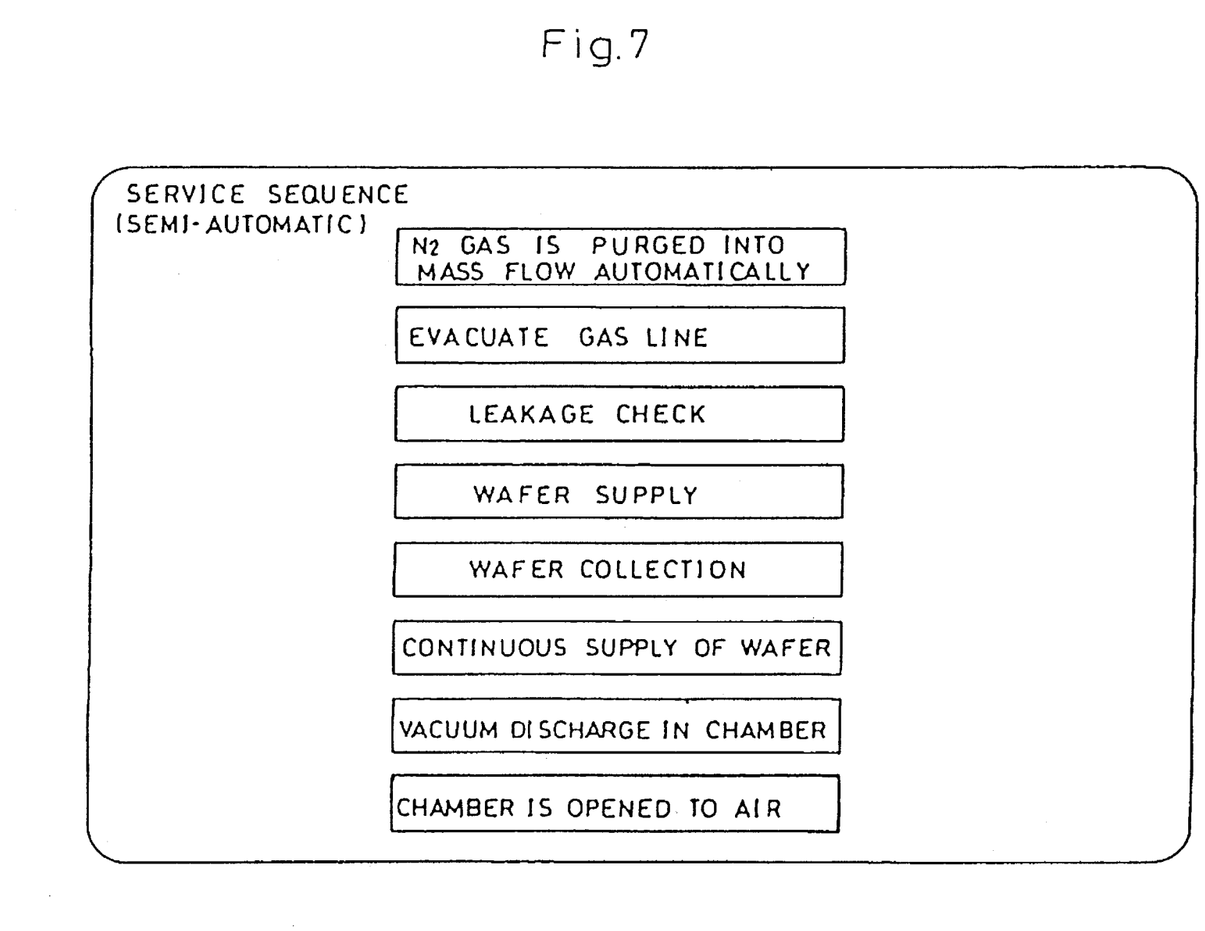
FIG. 7 is a block diagram of an instruction signal system of a semiconductor device producing apparatus according to a fourth embodiment of the present invention.

With reference to FIGS. 3 and 4, the following will discuss the detailed arrangement of a gas supply device 5 and a maintenance method according to a second embodiment of the present invention. In the second embodiment, too, the general arrangement of a semiconductor device producing apparatus is the same as that shown in FIG. 1. FIG. 3 is a section view schematically showing the inside arrangement of the gas supply device 5 for supplying $ClF_3$ gas or the like. As shown in FIG. 3, the gas supply device 5 has a casing 50 which defines the general form. Disposed in the casing 50 are a first bomb 51a for supplying $ClF_3$ gas serving as cleaning gas, and second and third bombs 51b, 5ic for supplying CVD gases such as $SiF_4$ gas, $O_2$ gas and the like. Each of the bombs 51a to 51c and the gas control unit 7 in FIG. 7 are connected to each other by each of process gas pipes 6a to 6c. The process gas pipes 6a to 6c are connected to a branch pipe of a nitrogen gas supply pipe 19b through first to third nitrogen leak valves 55a to 55c. The first process gas pipe 6a is connected to an air supply pipe 59a through an air leak valve 56 and a filter 57. Disposed at the air supply pipe 59a is a pressure sensor 58 for detecting the pressure in the first process gas pipe 6a. The casing 50 has a toxic gas exhaust pipe 52 as an emergency measure in case toxic gas leaks in the casing 50.

FIG. 4 is a flow chart illustrating a method of opening, to atmosphere, the first process gas pipe 6a when replacing the first bomb 51a for supplying $ClF_3$ gas in the gas supply device 5.

At the initial step ST21, the first process gas pipe 6a is filled with $ClF_3$ gas.

At a step ST22, a valve for the first bomb 51a is closed and a vacuum is drawn in the first process gas pipe 6a through another pipe (not shown) by the rotary pump 11. At a step ST23, nitrogen is introduced by opening the first nitrogen leak valve 55a connected to the first process gas pipe 6a. At a step ST24, a vacuum is again drawn in the first process gas pipe 6a. These seeps ST23 and ST24 are alternately repeated three times.

At a step ST25, the first nitrogen leak valve 55a is closed and the air leak valve 56 is opened such that air from which particles have been removed by the filter 57, is introduced into the first process gas pipe 6a. When it is made sure by the pressure sensor 58 that the pressure in the first process gas pipe 6a has become an atmospheric pressure, the air leak valve 56 is closed. At this point of time, the reaction of the chemical formula 1 mentioned earlier takes place, and the $ClF_3$ gas adsorbed to the inner wall of the first process gas pipe 6a is reacted with moisture in the air and then decomposed into HF gas and the like.

At steps ST26 and ST27, vacuum drawing and air introduction are repeated in the first process gas pipe 6a.

At a step ST28, the first bomb 51a for supplying $ClF_3$ gas is replaced in a known manner.

Likewise the first embodiment, the second embodiment can prevent the inner wall of a pipe from being corroded by $ClF_3$ gas, while assuring the safety of the human body.

Third Embodiment

Figure 5:
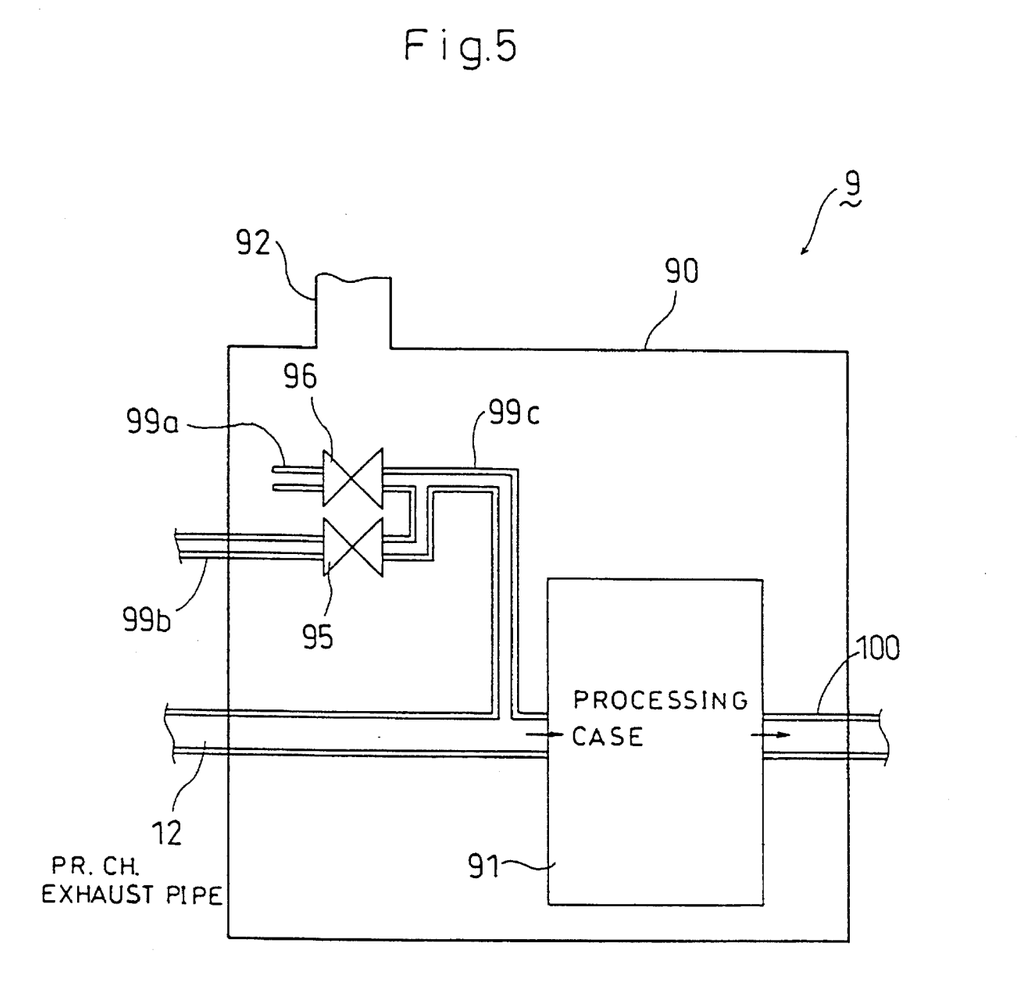
FIG. 5 is a section view schematically illustrating the arrangement of a waste gas processing device according to a third embodiment of the present invention.
Figure 6:
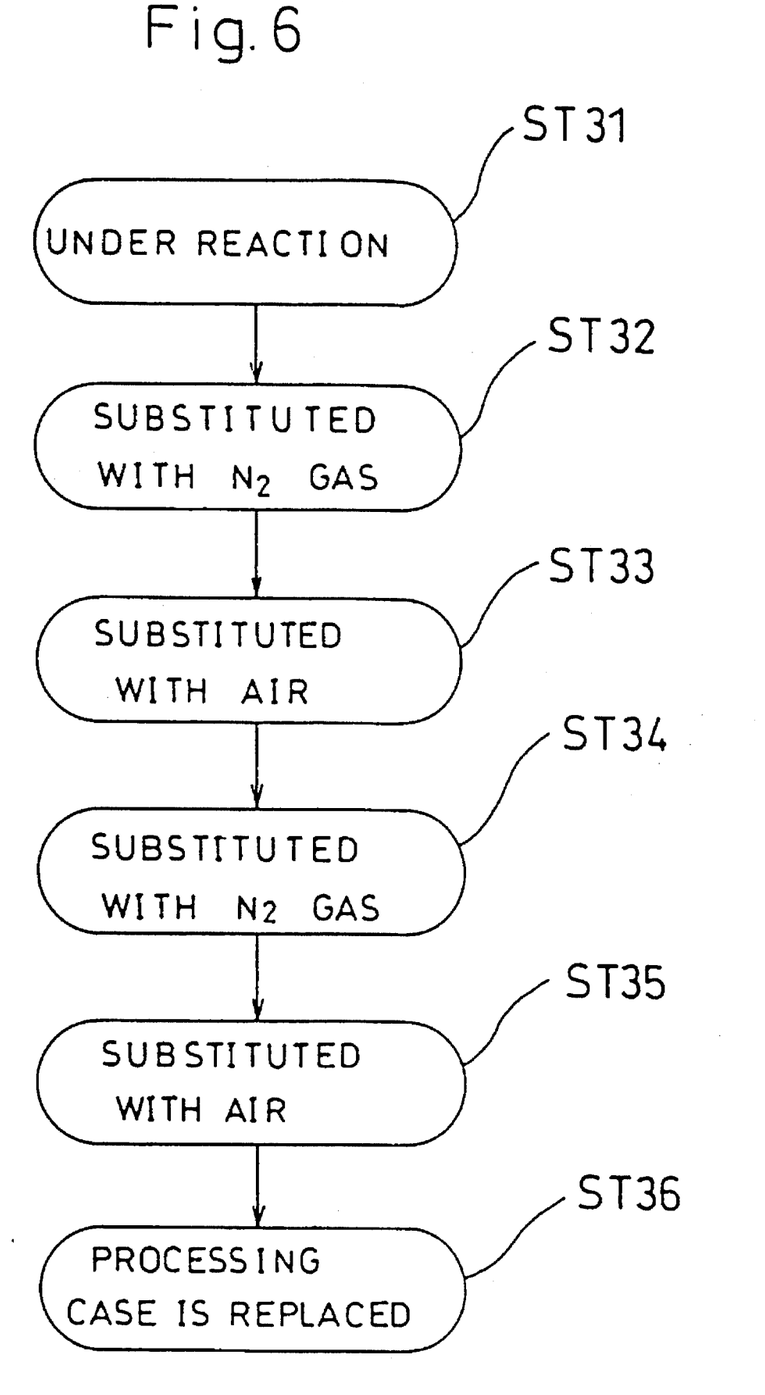
FIG. 6 is a flow chart of a method of opening, to atmosphere, an exhaust pipe of the processing chamber when replacing the processing case in the third embodiment.

The following description will discuss a third embodiment of the present invention with reference to FIGS. 5 and 6. In the third embodiment, too, the general arrangement of a semiconductor device producing apparatus is the same as that shown in FIG. 1. FIG. 5 is a view illustrating the inside arrangement of a waste gas processing device 9. As shown in FIG. 5, the waste gas processing device 9 is generally surrounded by a casing 90. Disposed in the casing 90 is a processing case 91 filled with a medicine for removing a variety of toxic gases. The processing case 91 is connected to the wafer processing chamber 1 in FIG. 1 through the processing chamber exhaust pipe 12 mentioned earlier. Connected to the processing case 91 is an external discharge pipe 100 for discharging, to the outside, safe gas from which toxic gases have been removed. Connected to the processing chamber exhaust pipe 12 are an air supply pipe 99a and a nitrogen gas supply pipe 99b through a common pipe 99c. An air leak valve 96 is disposed at the air supply pipe 99a, and a nitrogen leak valve 95 is disposed at the nitrogen supply pipe 99b. The casing 90 has, as an emergency measure, a toxic gas exhaust pipe 92 for discharging toxic gas from the casing 90, in case exhaust gas leaks in the casing 90.

As thus discussed, the waste gas processing device 9 in the third embodiment is different from each of the first and second embodiments in that there is not disposed the means for discharging interhalogen compound gas by vacuum drawing.

Based on the flow chart in FIG. 6, the following will discuss, with reference to FIG. 5, a method of opening the processing chamber exhaust pipe 12 to atmosphere when replacing the processing case 91 in the waste gas processing device 9.

At the initial step ST31, unreacted $ClF_3$ gas discharged from the rotary pump 11 into the processing chamber exhaust pipe 12, is adsorbed by or under reaction with a medicine in the processing case 91 of the waste gas processing device 9. Thus, only safe gas is discharged from the external discharge pipe 100.

When it is required to replace the medicine in the processing case 91, the processing is interrupted. At a step ST32, the atmosphere in the processing chamber exhaust pipe 12 is replaced with nitrogen gas. When opening, to atmosphere, the wafer processing chamber 1 and the first process gas pipe 6a in the first and second embodiments, the members to be opened to atmosphere can be evacuated. However, the member to be opened to atmosphere in the third embodiment cannot be evacuated in view of the structure thereof. Accordingly, for substituting the atmosphere with nitrogen gas, nitrogen gas is continuously supplied into the processing chamber exhaust pipe 12 at 10 liters/minute for 30 minutes. By this substitution of atmosphere with nitrogen gas, the concentration of $ClF_3$ gas can be lowered to such an extent that the pipe is not corroded, at the time of the next step ST33 of air introduction.

After the nitrogen leak valve 95 is closed, the air leak valve 96 is opened to introduce air into the processing chamber exhaust pipe 12 at the step ST33. At this time, the reaction of the chemical formula 1 takes place. Thus, $ClF_3$ gas adsorbed to the inner wall of the processing chamber exhaust pipe 12 is reacted with moisture in the air and then decomposed into HF gas or the like.

At a step ST34, the atmosphere of the processing chamber exhaust pipe 12 is substituted with nitrogen gas by the same operation as that at the step ST32. It is an object of the step ST34 to discharge the decomposition product such as HF or the like together with the air.

At a step ST35, air is introduced into the processing chamber exhaust pipe 12 by the same operation as that at the step ST33.

At a step ST36, the processing case 91 is replaced in a known manner.

In each of the first to third embodiments, since the devices and apparatus are installed in a clean room of which humidity is maintained at 60%, provision is made such that air is introduced directly into the wafer processing chamber. Table 1 shows the relationship between humidity and removing capacity.

TABLE I

| Humidity | 1 ppm | 1% | 10% | 60% |
|---|---|---|---|---|
| Removing Capacity | Substantially none | Small | Large | Large |

When provision is made such that there is used gas having humidity exceeding 14 such as nitrogen gas, instead of air used in each of the first to third embodiments, equivalent effects may be produced by a method similar to that in each embodiment. It is however difficult to decompose interhalogen compound gas with (i) process gas of which humidity is generally restrained to the order of ppm, such as $SiF_4$ gas, $O_2$ gas or the like, or (ii) dry air, dry nitrogen OF the like.

Fourth Embodiment

Figure 8:
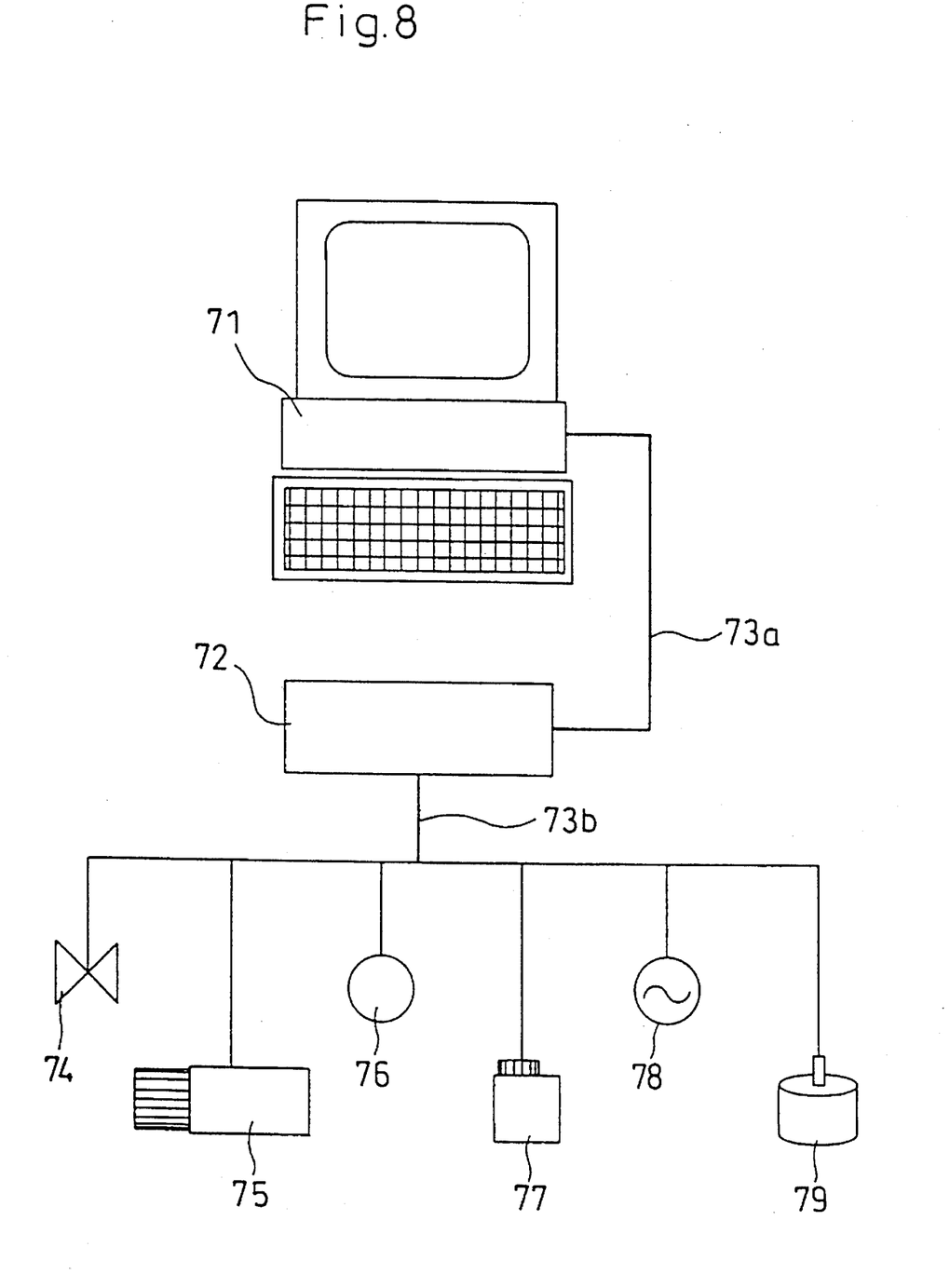
FIG. 8 is a view illustrating an example of a screen displaying a service sequence in the fourth embodiment.

With reference to FIGS. 7 and 8, the following description will discuss a fourth embodiment of the present invention for mass-production equipment. As shown in FIG. 7, the mass-production equipment has a service sequence for automatically carrying out an operation for bringing a gas line into a state where gas can flow therein, wafer collection or the like, or a sequence for maintenance, error resetting or the like of the apparatus. FIG. 8 is a block diagram of an instruction signal system for general mass-production equipment. In FIG. 8, there is disposed a personal computer 71 integral with a CRT into which an instruction is to be entered and which is to execute the instruction. A control rack 72 is connected to the personal computer 71 through a signal line 73a. An I/0 board is disposed at the control rack 72 to which there are connected, through a signal line 73b, a valve 74, a pump 75, a sensor 76, a mass flow 77, a power source 78, a motor 79 and the like. The process condition, valve opening/closing procedure for a wafer processing and the like are stored in the memory (not shown) of the personal computer 71. Thus, the wafer processing is automatically executed. In addition to an instruction for the wafer processing, the personal computer contains an instruction group of which procedure is determined for an operation of bringing a gas line into a state where gas can flow therein, a wafer collection or the like, such that such operation, wafer collection or the like can automatically be conducted as a service sequence.

FIG. 7 shows aft example of the CRT screen illustrating a service sequence. In addition to evacuating a gas line, wafer collection and the like, the sequence contains an operation for opening, to atmosphere, the chamber forming the wafer processing chamber. For opening the chamber to atmosphere, there is programmed a routine from the steps ST12 to ST17, out of the working routine of the flow chart in FIG. 2 discussed in connection with the first embodiment. When this service sequence is selected and executed, the routine from the steps ST12 to ST17 is automatically executed such that opening to atmosphere can securely be executed in a safe manner.

In each of the embodiments, there is shown procedure for conducting maintenance on the wafer processing chamber 1, the gas supply device 5, the waste gas processing device 9 and the like of the semiconductor device producing apparatus. The procedure above-mentioned can also be used for opening, to atmosphere, the inside of each of a variety of pneumatic devices such as the exhaust valve 10, the rotary pump 11 and the like. By so doing, the concentration of residual interhalogen compound gas such as $ClF_3$ gas or the like can be lowered, enabling part replacement to be readily conducted in a safe manner.

In each of the embodiments above-mentioned, there is shown a parallel plate-type plasma CVD apparatus as a semiconductor device producing apparatus. However, it is a matter of course that the present invention can be applied to a plasma CVD apparatus using an ECR plasma, a helicon wave excited plasma or an inductive coupled plasma, and etching apparatus using interhalogen compound gas.

Further, each of the embodiments has been discussed with $ClF_3$ gas used as interhalogen compound gas. Examples of the interhalogen compound gas include, in addition to $ClF_3$ gas, gases of compounds of interfluorine (F), interbromine (Br), interchlorine (Cl) and interiodine (I), such as $BrF_5$ gas (or $BrF_3$ gas), BrCl gas, $IF_3$ gas and the like. These example gases are very toxic and great in acting on corrosion of metals. Accordingly, when the method of opening a pneumatic device to atmosphere as shown in each of the first to fourth embodiments is applied to these interhalogen compound gases, there can be obtained effects similar to those produced in each of the embodiments above-mentioned.

What is claimed is:

1. A method of opening to the atmosphere the inside of a component of a system used for producing semiconductor devices and through which interhalgen compound gas passes in a hermetically sealed manner, said method comprising:

a. stopping the flow of gas through the semiconductor device producing system;

b. cleaning a component of the semiconductor device producing system containing a residual interhalogen compound gas by passing an inert gas through said component until the concentration of said residual interhalogen compound gas in said component is reduced to about 10 ppm and discharging said inert gas from said component into a processing device;

c. then cleaning said component through which said inert gas has been passed and discharged with a gas having a humidity exceeding 1% to decompose the remnants of said residual interhalogen compound gas into a substance and reducing the concentration of said residual interhalogen gas in the component to about 0.1 ppm and discharging said gas having a humidity exceeding 1% into said processing device; and d. opening to the atmosphere said component from which said substance has been discharged.

2. The method of opening, according to claim 1, wherein said interhalogen compound gas is at least one selected from the group consisting of $ClF_3$ gas, $BrF_3$ gas, $BrF_5$ gas, BrCl gas and $IF_3$ gas.

3. The method of opening according to claim 1, wherein said gas having humidity exceeding 1% is air.

4. The method of then opening according to claim 1, wherein said step of cleaning a component with inert gas and discharging said inert gas is repeated a plurality of times.

5. The method of opening according to claim 1, wherein said step of cleaning a component with a gas having a humidity exceeding 1% and discharging said gas is repeated a plurality of times.

6. The method of opening according to claim 1, wherein said step of cleaning said component with an inert gas involves increasing the pressure in said component with the inert gas before beginning the discharging of said inert gas, and wherein said step of cleaning said component with a gas having a humidity exceeding 1% involves increasing the pressure in said component with said gas before beginning the discharging of said gas.

7. The method of opening according to claim 1, wherein said step of cleaning a component with inert gas and discharging said inert gas is repeated a plurality of times, and wherein said step of cleaning a component with a gas having a humidity exceeding 1% and discharging said gas is repeated plurality of times.

* * * * *